(12) United States Patent
Kuroda et al.

(10) Patent No.: US 6,761,178 B2
(45) Date of Patent: Jul. 13, 2004

(54) TRANSFERRING APPARATUS AND SUBSTRATE PROCESSING APPARATUS

(75) Inventors: Osamu Kuroda, Tosu (JP); Takayuki Ogami, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 66 days.

(21) Appl. No.: 09/998,431

(22) Filed: Nov. 28, 2001

(65) Prior Publication Data

US 2002/0153098 A1 Oct. 24, 2002

(30) Foreign Application Priority Data

Nov. 29, 2000 (JP) ........................................ 2000-362989

(51) Int. Cl.[7] ................................................. B08B 3/04
(52) U.S. Cl. .................. 134/56 R; 134/58 R; 134/140; 134/158; 134/902
(58) Field of Search ............................ 134/56 R, 57 R, 134/58 R, 137, 140, 158, 902; 414/222.01, 222.02, 222.13; 901/1, 46, 49

(56) References Cited

U.S. PATENT DOCUMENTS

| 5,179,329 A | * | 1/1993 | Nishikawa et al. |
| 5,283,739 A | * | 2/1994 | Summerville et al. |
| 5,361,023 A | * | 11/1994 | Kim |
| 5,482,068 A | * | 1/1996 | Kitahara et al. |
| 5,545,960 A | * | 8/1996 | Ishikawa |
| 5,559,696 A | * | 9/1996 | Borenstein |
| 5,570,285 A | * | 10/1996 | Asaka et al. |
| 5,652,489 A | * | 7/1997 | Kawakami |
| 5,764,014 A | * | 6/1998 | Jakeway et al. |
| 5,819,008 A | * | 10/1998 | Asama et al. |
| 5,903,124 A | * | 5/1999 | Kawakami |
| 5,919,529 A | * | 7/1999 | Matsumura |
| 6,059,507 A | * | 5/2000 | Adams |
| 6,235,634 B1 | * | 5/2001 | White et al. |
| 6,377,888 B1 | * | 4/2002 | Olch |

FOREIGN PATENT DOCUMENTS

| DE | 4415736 | * | 11/1995 |
| JP | 5-73143 | * | 3/1993 |
| JP | 7-332965 | * | 12/1995 |
| JP | 9-94783 | * | 4/1997 |

* cited by examiner

Primary Examiner—Frankie L. Stinson
(74) Attorney, Agent, or Firm—Morrison & Foerster LLP

(57) ABSTRACT

A cleaning apparatus 11 includes a cleaning bath 30 for cleaning wafers W, a wafer guide 31 moving up and down to accommodate the wafers W in the cleaning bath 30, a motor 49 for moving the wafer guide 31 up and down, an absolute encoder 33 for detecting the position of the wafer guide 31, a driver 62 and a controller 63. The absolute encoder 33 detects a rotational angle of a rotating shaft 53 of the motor 49 and outputs a detection signal to the driver 62. Based on this detection signal, the driver 62 detects the position of the wafer guide 31 and further outputs the positional information of the wafer guide 31 to the controller 63. Thus, the invention provides a transferring apparatus and a substrate processing apparatus both of which allow of easy detection of the wafer guide and further facilitate their maintenance.

8 Claims, 10 Drawing Sheets

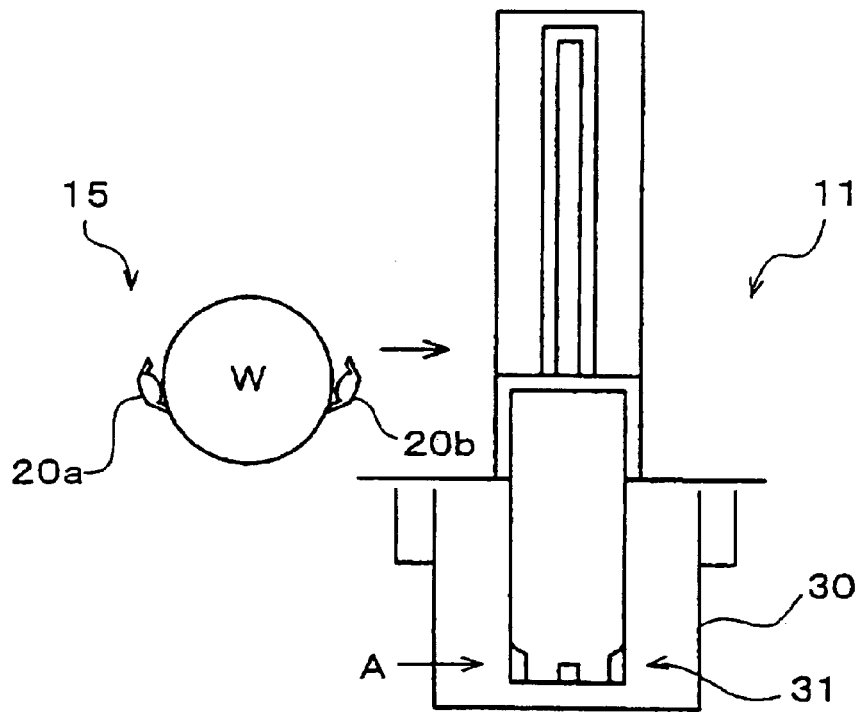
F I G. 6
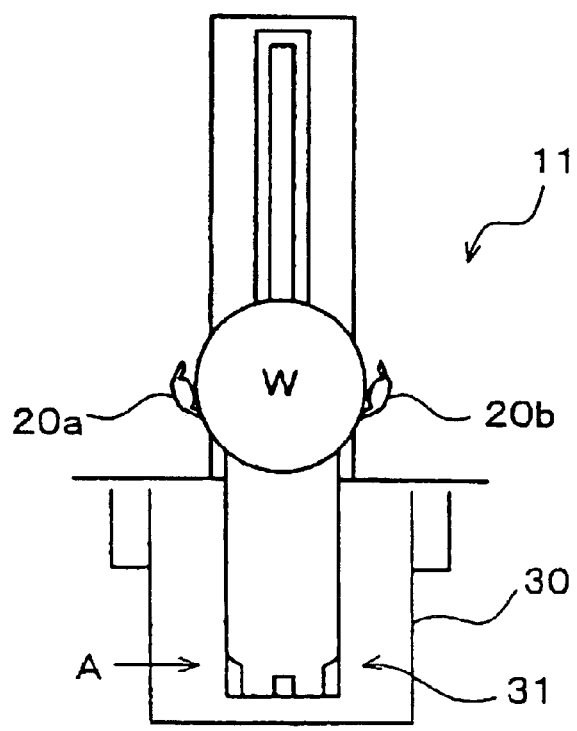
F I G. 7

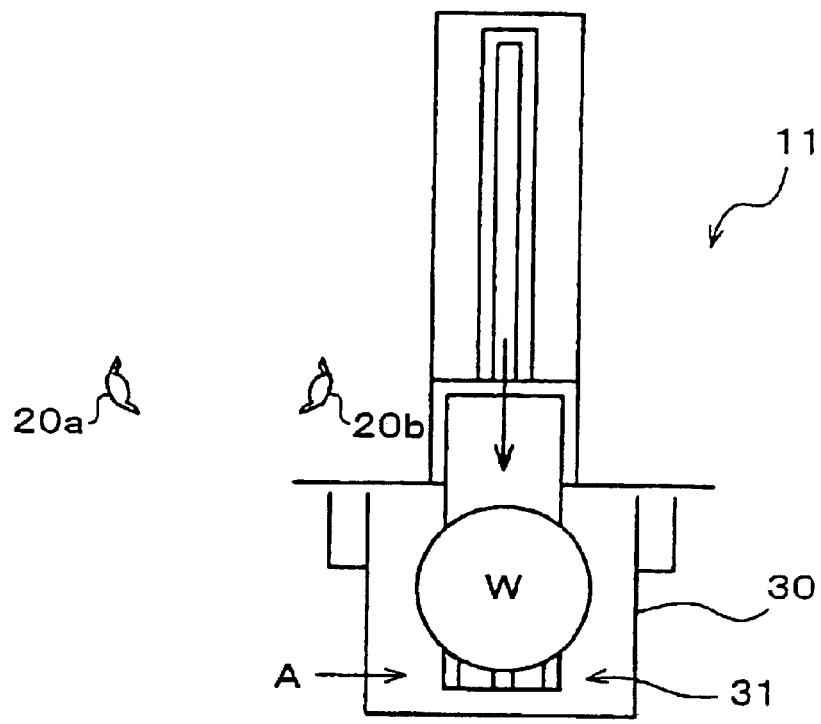
F I G. 10
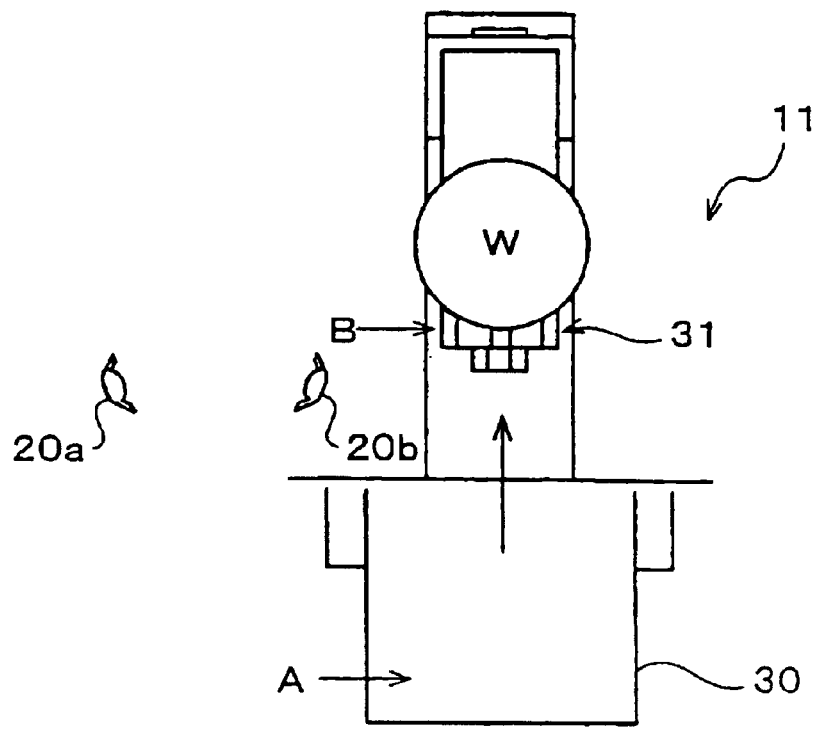
F I G. 11

TRANSFERRING APPARATUS AND SUBSTRATE PROCESSING APPARATUS

BACKGROUND OF THE INVENTION

1. Technical Field of the Invention

This invention relates to a transferring apparatus for transferring a substrate, for example, semiconductor wafer, LCD substrate glass, etc. and also relates to a substrate processing apparatus and a substrate processing system both performing the cleaning operation etc. for these substrates.

2. Description of the Related Art

For instance, in the manufacturing process for semiconductor devices, there widely spreads a cleaning system where semiconductor wafers (will be referred "wafers" below) are cleaned by a cleaning liquid to remove various contamination adhering to the wafers, for example, particles, organic pollutant, metallic impurities, etc. Especially, there is widely used a cleaning system that includes a wet-type cleaning apparatus to dip wafers into the cleaning liquid for the cleaning process.

In general, the conventional cleaning apparatus is equipped with a cleaning bath fulfilling a cleaning liquid and a wafer guide for dipping the wafers into the cleaning bath. The wafer guide can move up and down between the inside of the cleaning bath and its upside along a vertical guide-Z shaft. After receipt of the wafers on the upside of the cleaning bath, the wafer guide is lowered into the cleaning bath to dip the wafers into the cleaning liquid for cleaning the wafers. The cleaning system equipped with a number of cleaning apparatuses mentioned above includes a loader/unloader part where the wafers are taken out of carriers and the wafers are accommodated into the carriers and a transferring apparatus that transfers the wafers between the loader/unloader part and the respective cleaning apparatuses. With the movement of wafer chucks along the respective cleaning apparatuses in the horizontal direction, the transferring apparatus can move the wafer chucks to the respective cleaning apparatuses. For example, after moving the wafer chucks to the upside of the cleaning bath of one cleaning apparatus, the wafer guide is elevated to carry out the delivery of the wafers.

In the cleaning system as above, it is necessary to detect the position (level) of the wafer guide in order to avoid a conflict between the wafer guide and the wafer chucks, for example. Therefore, the conventional system is provided, at respective levels along the above-mentioned guide-Z shaft, with a plurality of photoelectric sensors which detect the position of the wafer guide.

Accordingly, the conventional system has to establish a number of photoelectric sensors for every cleaning apparatuses, thereby causing the number of photoelectric sensors to be increased. Moreover, the increase in the number of photoelectric sensors is accompanied by frequent exchanges for parts and maintenance. Further, in case of the guide-Z shaft in the cleaning apparatus, every maintenance of the apparatus requires a cover etc. to be removed for completing a worker's operation inside the apparatus, causing a troublesome operation.

SUMMARY OF THE INVENTION

Taking the above situation into consideration, an object of the present invention is to provide a transferring apparatus, a substrate processing apparatus and a substrate processing system, all of which allow of positional detection with ease and further facilitate the maintenance per se.

The first feature of the present invention resides in the provision of a transferring apparatus comprising at least two moving bodies with mutual interference potential, at least one moving body being driven by a motor; and a detection unit for detecting a position of the at least one moving body driven by the motor; wherein the detection unit includes an absolute encoder directly connected to the motor thereby to detect a revolution amount of a rotating shaft of the motor and further output a detection signal, a driver which receives the detection signal outputted from the absolute encoder thereby to output a positional information, and a controller which receives the positional information outputted from the driver thereby to judge the position of the moving body; and the controller controls in a manner that the moving bodies do not interfere with each other.

The second feature of the present invention resides in that the controller inputs an establishment for control program into the driver, while the driver controls the motor on a basis of the inputted establishment.

The third feature of the present invention resides in that the positional information outputted from the driver to the controller is identical to a sensor output which is generated by detecting whether the moving body is positioned in a predetermined area when the rotating shaft is rotating and/or stops rotating.

The fourth feature of the present invention resides in that the moving body is a substrate holder that moves while holding a substrate.

The fifth feature of the present invention resides in the provision of a substrate processing apparatus comprising: a transferring apparatus including: at least two substrate holders with mutual interference potential, at least one substrate holder being driven by a motor; and a detection unit for detecting a position of the at least one substrate holder; wherein the detection unit includes: an absolute encoder directly connected to the motor thereby to detect a revolution amount of a rotating shaft of the motor and further output a detection signal; a driver which receives the detection signal outputted from the absolute encoder thereby to output a positional information; and a controller which receives the positional information outputted from the driver thereby to judge the position of the substrate holder; wherein the controller controls in a manner that the substrate holders do not interfere with each other; and a processing bath for processing a substrate; wherein the substrate holder is movable to accommodate the substrate in the processing bath. The processing bath for processing the substrate is filled up with a processing liquid, for example, a cleaning liquid. The substrate holder can dip the substrate into the processing liquid in the processing bath because the holder is movable while holding the substrate.

The sixth feature of the present invention resides in the provision of a substrate processing apparatus which comprises:

a transferring apparatus including: at least one first substrate holder and at least one second substrate holder with mutual interference potential, the at least one first substrate holder being driven by a motor; and a detection unit for detecting a position of the at least one first substrate holder; wherein the detection unit includes: an absolute encoder directly connected to the motor thereby to detect a revolution amount of a rotating shaft of the motor and further output a detection signal; a driver which receives the detection signal outputted from the absolute encoder thereby to output a positional information; and a controller which receives the positional information outputted from the driver thereby to judge the position of the first substrate holder; wherein the controller controls in a manner that the substrate holders do not interfere with each other; and a processing bath for processing a substrate;

wherein the first substrate holder is movable to accommodate the substrate in the processing bath, while the second substrate holder transfers the substrate thereby to give and receive the substrate to and from the first substrate holder; and the second substrate holder is provided with drive means for moving the second substrate holder and the controller controls the drive means and the motor.

The seventh feature of the present invention resides in that the controller controls the drive means and the motor so that the first substrate holder does not collide with the second substrate holder.

The eighth feature of the present invention resides in the provision of an apparatus comprising a plurality of processing baths arranged in a horizontal direction to process a substrate therein; a plurality of first substrate holders provided for the plurality of processing baths respectively, the first substrate holders each moving between a position inside the corresponding processing bath and another position above the corresponding processing bath, in a vertical direction; a plurality of vertical movement units for moving the plurality of first substrate holders in the vertical direction; a second substrate holder which holds the substrate and moves to the horizontal direction above the plurality of processing baths; a horizontal movement unit for moving the second substrate holder in the horizontal direction; and a control unit which drives the vertical movement units and the horizontal movement unit so that the first substrate holders and the second substrate holder do not interfere with each other, thereby to move the first substrate holders and the second substrate holder.

The ninth feature of the present invention resides in that the substrate processing apparatus further comprises a plurality of position sensors which are arranged in respective positions along a horizontal movement of the second substrate holder thereby to detect various horizontal positions of the second substrate holder.

The tenth feature of the present invention resides in the provision of a transferring apparatus comprising a moving body driven by a motor, an absolute encoder directly connected to the motor and a controller for detecting a position of the moving body on a basis of a signal outputted from the absolute encoder. In this way, since the controller detects the position of the moving body on a basis of the signal outputted from the absolute encoder, it is possible to detect the position of the moving body with ease. Note, the substrate is illustrated by a substrate, such as semiconductor wafer, LCD substrate glass, etc. Besides these substrates, the substrate may be formed by any one of CD substrate, printed baseplate, ceramic substrate, etc.

The 11th. feature of the present invention resides in the provision of a transferring apparatus comprising a moving body driven by a motor and detector for detecting a position of the moving body, wherein the detector includes an absolute encoder directly connected to the motor thereby to detect a revolution amount of a rotating shaft of the motor and further output a detection signal, a driver which receives the detection signal outputted from the absolute encoder thereby to output a positional information, and a controller which receives the positional information outputted from the driver thereby to judge the position of the moving body.

Thus, in the detector, the absolute encoder detects the revolution amount of the rotating shaft of the motor thereby to output the detection signal, while e.g. the driver detects the position of the moving body on the ground of the above detection signal. Therefore, the detecting of the position of the moving body can be performed with ease. Again, the driver outputs the positional information to the controller, while the controller confirms whether e.g. the moving body is positioned as commanded. Here, as the absolute encoder outputs e.g. the absolute angle as the revolution amount of the rotating shaft, the driver can detect the position of the moving body on the ground of the output value of the detection signal. Moreover, owing to the adoption of the absolute encoder, even if e.g. a sudden power cut is caused, the position of the moving body could be memorized and therefore, there is no need to redo the initializing of the apparatus.

BRIEF DESCRIPTION OF THE DRAWINGS

FIG. 6 is an explanatory view of a process to load the wafers into the cleaning apparatus;

FIG. 7 is an explanatory view of a process showing a condition that the wafers have been brought above the cleaning bath;

FIG. 10 is an explanatory view of a process showing a condition that the wafers are accommodated into the cleaning bath;

FIG. 11 is an explanatory view of a process showing a condition that the cleaned wafers are raised above the cleaning bath;

DESCRIPTION OF THE PREFERRED EMBODIMENT

With reference to FIGS. 1 to 14, embodiments of this invention will be described in detail, below. These embodiments will be described on the ground of a cleaning apparatus as a substrate processing apparatus, which is constructed so as to clean the wafers as an example of substrates.

Figure 1:
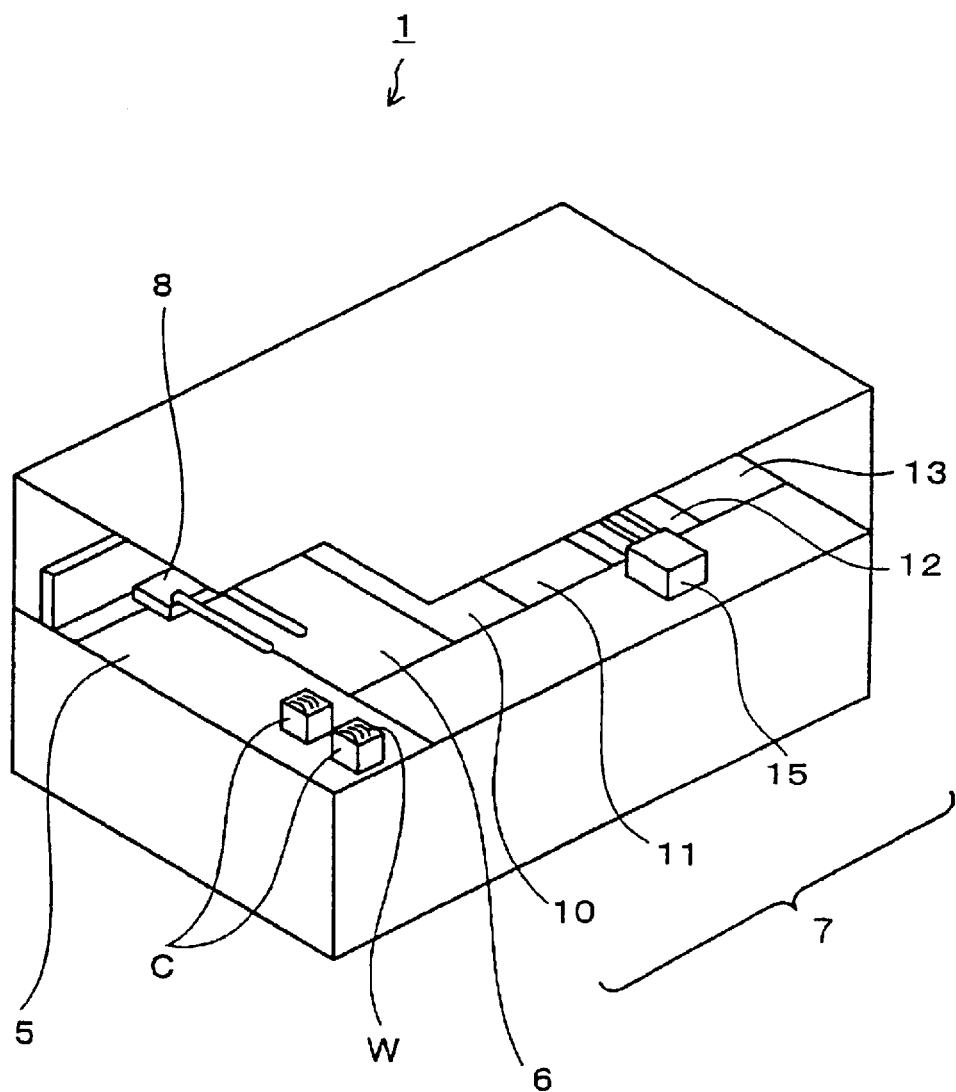
FIG. 1 is a perspective view of a cleaning system in accordance with an embodiment of the present invention.

FIG. 1 is a perspective view of a cleaning system 1 as the substrate processing system, which is equipped with cleaning apparatuses 11, 12, 13 of the embodiment. The cleaning system 1 is constructed so as to wash and dry the wafers W.

The cleaning system 1 includes a carrier loading/unloading part 5 into which carriers C each accommodating a plurality of wafers W are loaded and from which the carriers are unloaded, a loader/unloader part 6 to take the wafers W out of the carrier and also accommodate the wafers into the carrier and a cleaning/drying part 7 for cleaning and drying the wafers W. Between the carrier loading/unloading part 5 and the loader/unloader part 6, the carriers C are transferred by a transfer arm 8 for transporting the carrier C that forms a container capable of accommodating a moving body, for example, the wafers W. In the cleaning/drying part 7, there are arranged, in order closer to the loader/unloader part 6, a drying apparatus 10 for drying the wafers W by using e.g. IPA (isopropyl alcohol) vapor and the above cleaning apparatuses 11, 12, 13 for firstly performing the cleaning operation against the wafers W with a cleaning liquid having chemical components as the main ingredients and subsequently performing the rinsing operation with pure water. The chemical components in the cleaning liquids used in the cleaning apparatuses 11 to 13 are different from each other. The cleaning/drying part 7 is provided with a transferring apparatus 15 for transferring the wafers W between the loader/unloader part 6 and the drying apparatus 10 and also among the cleaning apparatus 11, 12, 13.

Figure 2:
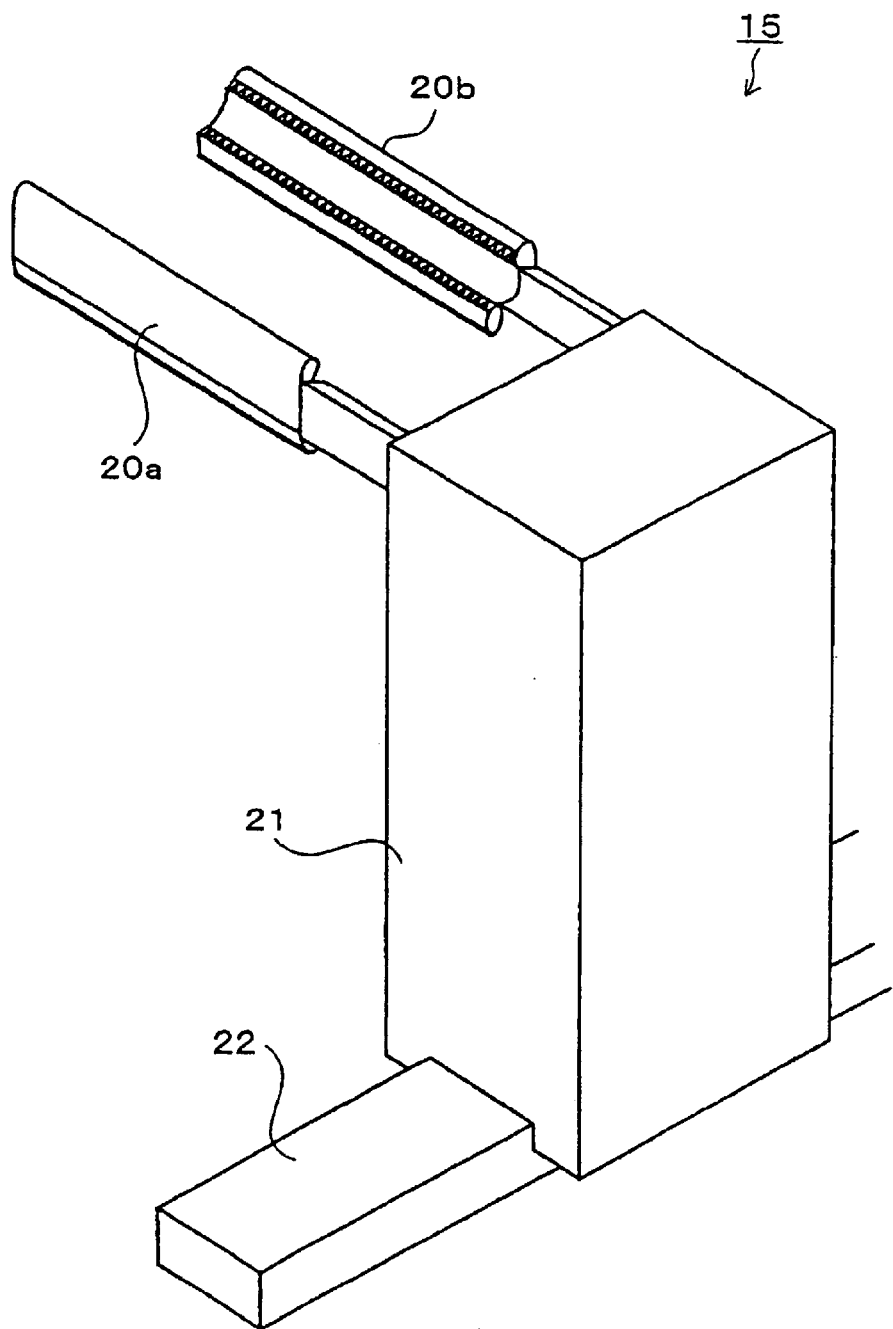
FIG. 2 is a perspective view of a transferring apparatus.

As shown in FIG. 2, the transferring apparatus 15 includes a pair of left/right wafer chucks 20a, 20b as transferring/holding means for holding and transferring the wafers W as a moving body and transferring/driving means 21 for moving the wafer chucks 20a, 20b along the loader/unloader part 6, the drying apparatus 10 and the cleaning apparatuses 11 to 13 in the horizontal direction. Between the left/right wafer chucks left 20a, 20b, there is defined a clearance that allows substrate holding means as another moving body mentioned later, for example, a wafer guide 31 to pass therethrough. The transferring/driving means 21 is constructed so as to slide on a rail 22 extending in the longitudinal direction of the cleaning system 1 (i.e. direction to arrange the drying apparatus 10 and the cleaning apparatuses 11 to 13).

Figure 3:
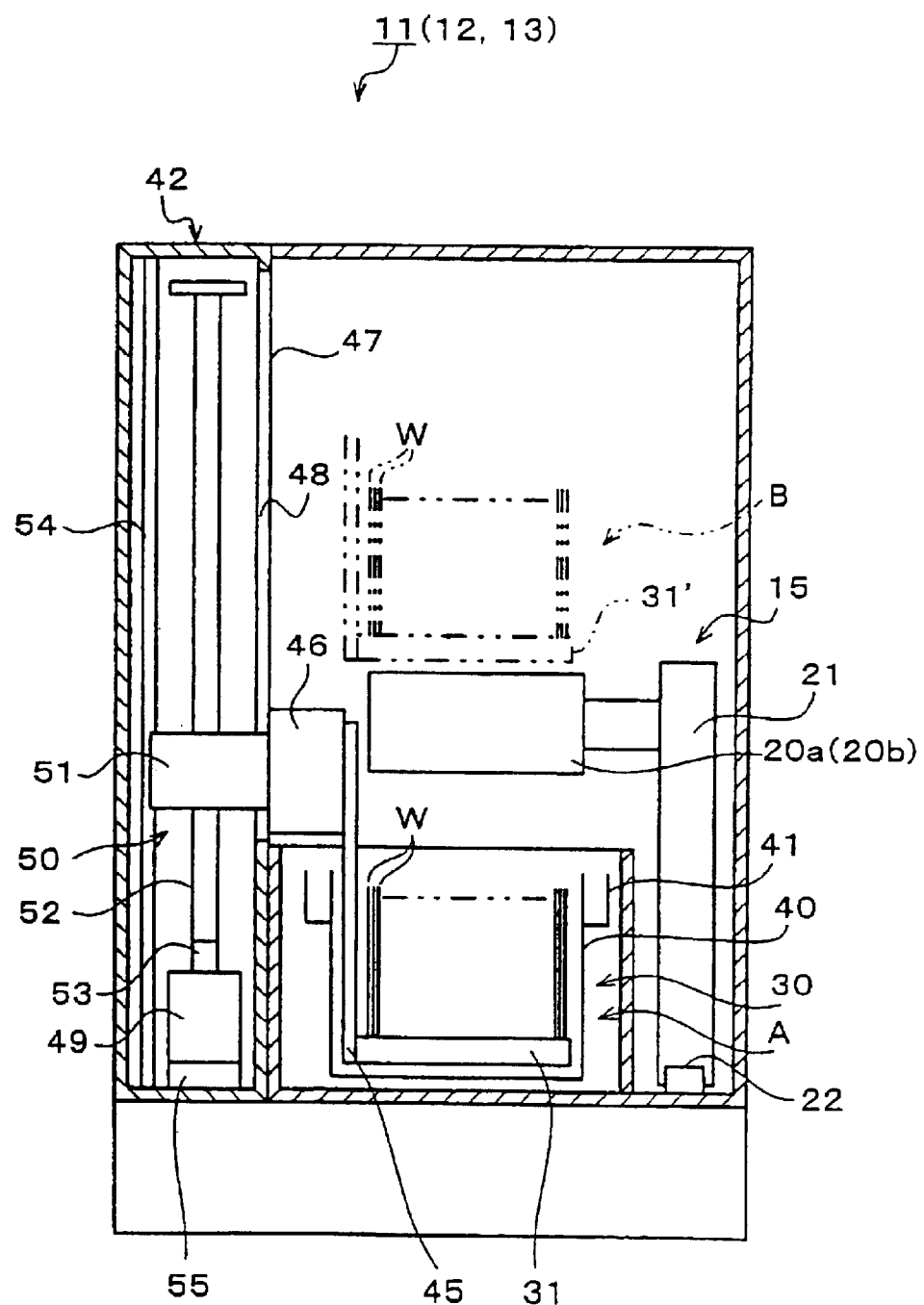
FIG. 3 is a longitudinal sectional view of a cleaning apparatus in accordance with an embodiment of the present invention.

As the cleaning apparatuses 11 to 13 have constitutions similar to each other, we now explain the constitution of the cleaning apparatus 11 representatively. FIG. 3 is a longitudinal sectional view of the cleaning apparatus 11. As shown in FIG. 3, the cleaning apparatus 11 has a cleaning bath 30 as a processing bath to clean the wafers W.

The cleaning bath 30 includes a box-shaped inner bath 40 of size enough to accommodate the wafers W and an outer bath 41 attached to the inner bath 40 so as to surround its opening. The cleaning bath 30 is adapted so as to be filled with a cleaning liquid, for example, pure water, various chemical liquids, etc.

Further, the cleaning apparatus 11 is provided with a transferring apparatus 42 having a wafer guide 31 for holding the wafers W. The transferring apparatus 42 moves the wafer guide 31 up and down in order to accommodate the wafers W in the cleaning bath 30.

Figure 4:
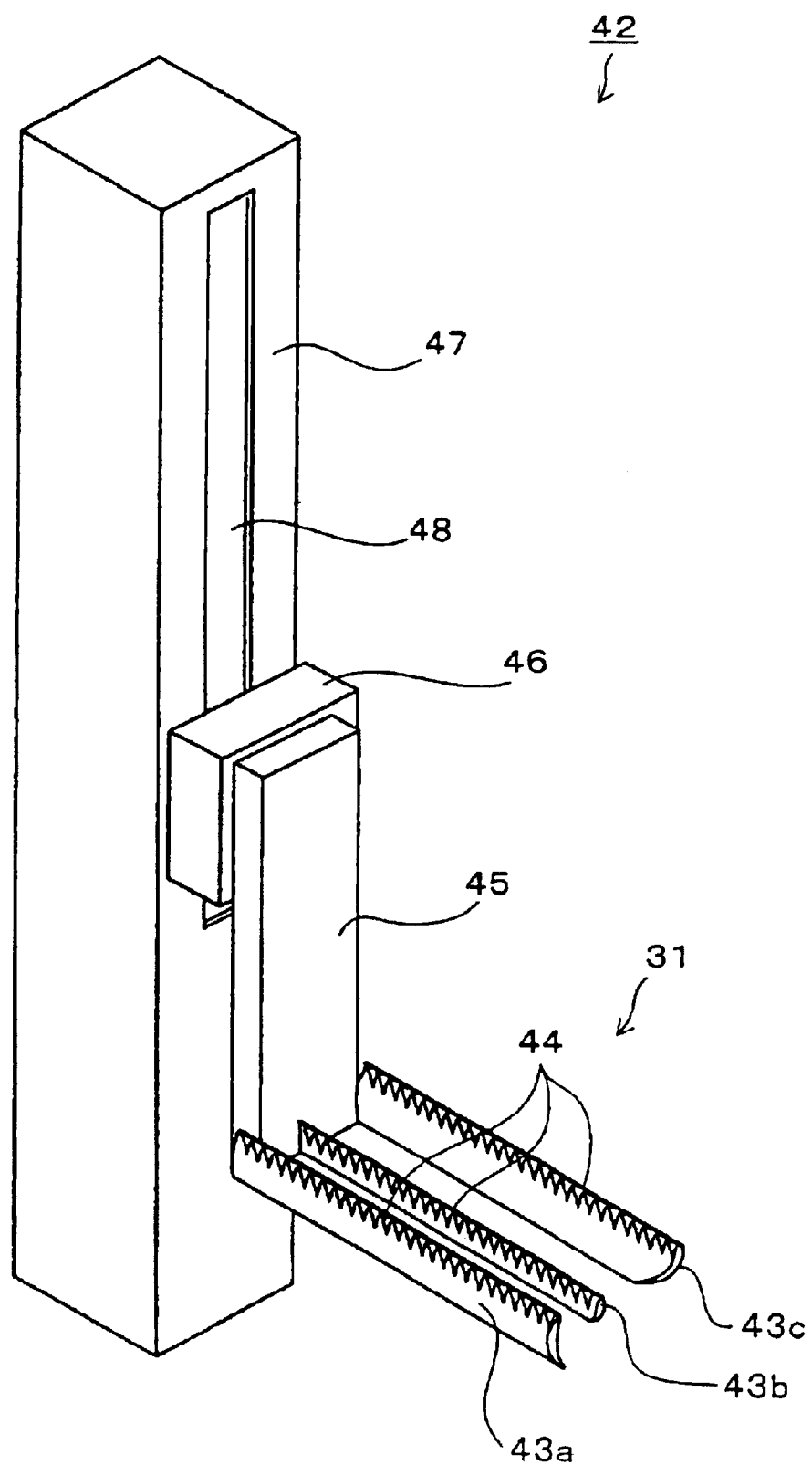
FIG. 4 is a perspective view of a wafer guide.

As shown in FIG. 4, the wafer guide 31 is equipped with three parallel holding members 43a, 43b, 43c. Each of the holding members 43a to 43c has a plurality (e.g. fifty) of grooves 44 formed at regular intervals to hold peripheral lower parts of the wafers W. When inserting the peripheries of fifty wafers W of two carriers C into the grooves 44 formed on the holding members 43a to 43c respectively, the wafer guide 31 is capable of retaining the plural wafers W while they are arranged at regular intervals.

Taking up respective horizontal postures, the holding members 43a to 43c are fixed to a support body 45 having its back face to which an elevating member 46 is attached. Passing through a groove 48 formed on the front face of a cover member 47, the elevating member 46 is connected to a nut 51 of a ball/nut mechanism 50 accommodated in the cover body 47, as shown in FIG. 3. This nut 51 is fitted so as to be movable along a guide-Z shaft 54 extending up and down in the cover body 47, so that the wafer guide 31 can move up and down along the guide-Z shaft 54.

In the ball/nut mechanism 50, a ball screw shaft 52 is connected with a rotating shaft 53 of a motor 49 through a coupling (not shown). The motor 49 is provided, in coaxial with the rotating shaft 53, with the ball screw shaft 52 and a rotating shaft (not shown) of an absolute encoder 55 mentioned later, performing a role as driving means for moving the above-mentioned wafer guide 31 up and down. By rotating or reverse-rotating the rotating shaft 53 and the ball screw shaft 52 by the drive of the motor 49, the wafer guide 31 moves up and down to occupy a state (cleaning position A) where the wafer guide 31 (as shown with solid lines of FIG. 3) is lowered into the cleaning bath 30 thereby to dip the wafers W into the cleaning liquid filled in the cleaning bath 30 and also another state (upward position B) where the wafer guide 31' (as shown with double dashed lines of FIG. 3) is elevated above the cleaning bath 30 thereby to lift the wafers W above the cleaning bath 30. Again, since the wafer guide 31 is moved up and down by the rotating and reverse-rotating of the rotating shaft 53 (the ball screw shaft 52) of the motor 49, there is established a proportional relationship between the rotating angle of the rotating shaft 53 of the motor 49 and the position (level) of the wafer guide 31.

During the slide movement of the afore-mentioned transferring apparatus 15 along the rail 22 by the drive of the transferring/driving means 21, the wafer chucks 20a, 20b are arranged in respective positions to allow the chucks 20a, 20b to pass between the wafer guide 31 moved (lowered) to the cleaning position A and the wafer guide 31' moved (raised) to the upward position B.

The motor 49 is equipped with the absolute encoder 55 in direct connection. In other words, the motor 49 and the absolute encoder 55 are not provided in the form of different bodies but formed into one body. Forming one constituent of detecting means for detecting the position of the wafer guide 31 on the basis of the revolution amount of the rotating shaft 53 of the motor 49, for example, a rotational position of the shaft, this absolute encoder 55 forms a transmission/non-transmission pattern of light by e.g. slit patterns formed on a rotary disc, so that the rotational position of the shaft 53 from its optional point of reference of the motor 49, that is, the rotating angle (absolute angle) of the shaft 53 can be detected by the so-formed slit pattern. As mentioned before, since the rotating angle of the rotating shaft 53 of the motor 49 and the position of the wafer guide 31 are under the proportional relationship, it is possible to detect the position of the wafer guide 31 by the rotating angle of the drive shaft 53 detected by the absolute encoder 55.

Till now, the structure of the cleaning apparatus 11 has been described representatively. Similarly, each of the other cleaning apparatuses 12, 13 is provided with the similar structure and also includes the cleaning bath 30 as the processing bath and the wafer guide 31 as the holding means for the wafers W. Additionally, also in the other cleaning apparatuses 12, 13, it is possible to detect the position of the wafer guide 31 by detecting the absolute angle of the drive shaft 53 of the motor 49 by means of the absolute encoder 55.

Figure 5:
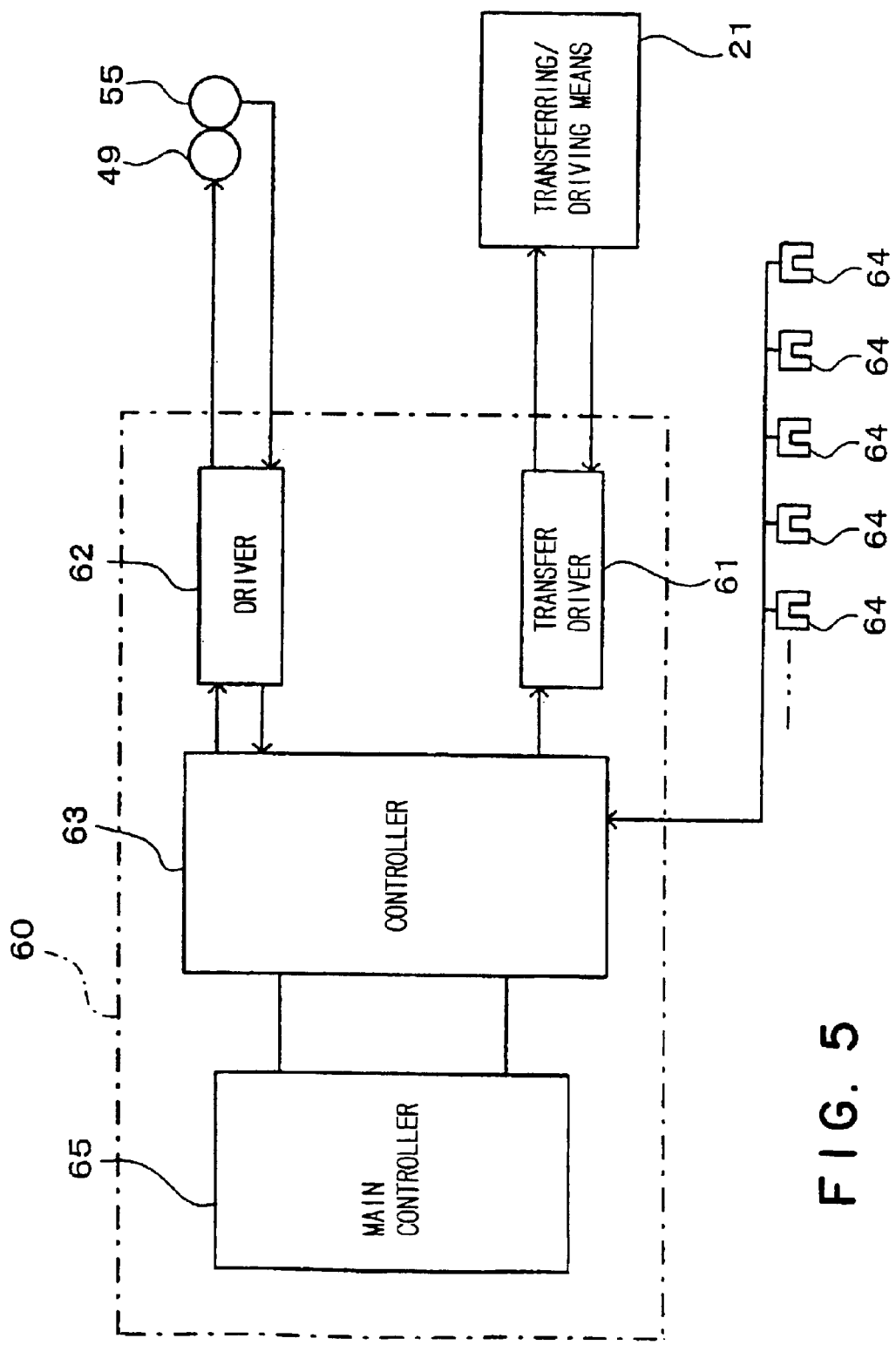
FIG. 5 is a block diagram showing a control system of the cleaning system of the embodiment of the present invention.

FIG. 5 is a block diagram showing the control system of the cleaning system 1 of the embodiment. This cleaning system 1 has the transferring/driving means 21 of the transferring apparatus 15 and control means 60 for controlling the motor 49 to move the wafer guide 31 up and down. The control means 60 is provided with a transfer driver 61 which outputs an operation command to the transferring/driving means 21 and a driver 62 which also outputs an operation command to the motor 49. Note, such a control system is applicable to all driving means using a motor.

The transfer driver 61 and the transferring/driving means 21 are constructed in the form of a servo-system. A detection signal is generated to the transfer driver 61 through an encoder (not shown) built in the transferring/driving means 21. Owing to the detection signal inputted in this way, the transfer driver 61 can obtain the positional information about the wafer chucks 20a, 20b, for example, one information that they are sliding along the rail 22 now, another information that the wafer chucks 20a, 20b are present at any one of the loader/unloader part 6, the drying apparatus 10 and the cleaning apparatuses 11 to 13. From the controller 63, an establishment for e.g. a sequence control program etc. is loaded to the transfer driver 61. Based on the so-inputted establishment, the transfer driver 61 controls the operation of the transferring/driving means 21 to move the wafer chucks 20a, 20b to respective designated positions.

Further inputted into the controller 63 are detection signals from a number of position sensors 64 which are arranged along the rail 22 at predetermined intervals. Owing to the detection signal inputted in this way, the controller 63 can obtain the positional information about the wafer chucks 20a, 20b. For example, when the detection signals are generated from the position sensors 64 in sequence, then the controller 63 obtains the information that the wafer chucks 20a, 20b are now sliding along the rail 22 now. When a detection signal is generated from any one of the position sensors 64, then the controller 63 obtains the information that the wafer chucks 20a, 20b are present at any one of the loader/unloader part 6, the drying apparatus 10 and the cleaning apparatuses 11 to 13. For example, when an ON (or OFF) signal is outputted from the position sensor 64 corresponding to the cleaning apparatus 11, the controller 63 recognizes a situation that the wafer chucks 20a, 20b are arranged above the cleaning bath 30 of the cleaning apparatus 11. Thereafter, when an OFF (or ON) signal is outputted from the position sensor 64, the controller 63 recognizes a situation that the wafer chucks 20a, 20b have been withdrawn from the upside of the cleaning bath 30 in the cleaning apparatus 11.

Normally, when moving the wafer chucks 20a, 20b, a command pulse is outputted from the controller 63 to the transfer driver 61 and then a drive current flows from the controller 63 to the transferring/driving means 21. While, the positional information of the wafer chucks 20a, 20b is fed back from the transferring/driving means 21 to the transfer driver 61. Additionally, in the controller 63 having the positional information of the wafer chucks 20a, 20b by the outputs of the position sensors 64, it is confirmed whether the wafer chucks 20a, 20b have been brought to the designated positions on command or not.

The motor 49, the absolute encoder 55 and the driver 62 are constructed in the form of a servo-system. Again, the absolute encoder 55, the driver 62 and the controller 63 function as the detecting means for detecting the position of the wafer guide 31. A detection signal about the rotating angle of the rotating shaft 53 of the motor 49 is transmitted from the absolute encoder 55 to the driver 62. As mentioned before, since there is established a proportional relationship between the rotating angle of the rotating shaft 53 of the motor 49 and the position of the wafer guide 31, the driver 62 detects the position (level) of the wafer guide 31 on the basis of the above detection signal about the rotating angle inputted from the absolute encoder 55. Due to this detection, the driver 62 can obtain the positional information of the wafer guide 31, for example, the information that the wafer guide 31 is present at the cleaning position A or the upward position B, the information that the wafer guide 31 is moving up or down between the cleaning position A and the upward position B, etc. Then, the driver 62 outputs the so-obtained positional information to the controller 63, in the form of an output of the position sensor. While, the controller 63 inputs an establishment for sequence control program etc. into the driver 62. Based on the so-inputted establishment, the driver 62 controls the operation of the motor 49 to move the wafer guide 31 to a designated position (level).

According to the teaching work to determine respective positions (positioning) of the wafer guide 3, for example, the cleaning position A and the upward position B, it is carried out to move the wafer guide 31 to a certain position in the cleaning bath 30 and further establish the above certain position as the cleaning position A. The establishment is accomplished by allowing the driver 62 to memorize the detection signal, which has been outputted from the absolute encoder 55 at the time of moving the wafer guide 31 to the certain position in the cleaning bath 30, as the positional data corresponding to the cleaning position A. Alternatively, upon allowing the driver 62 to memorize an output of the detection signal from the absolute encoder 55 and also somewhat plus and minus variations on both sides of the output as the center, the cleaning position A may be established from an optional range of positions. In order to establish the upward position B in the driver 62, it is carried out to move the wafer guide 31 up to a designated position above the cleaning bath 30. Further, an output of detection signal from the absolute encoder 55 at that time is memorized in the driver 62, as the positional data corresponding to the upward position B, thereby effecting the establishment of the upward position B. Again, at the driver 62, an output of detection signal when, for example, the wafer guide 31 is present at the cleaning position A is established as a basic reference value, while another output of detection signal when, for example, the wafer guide 31 is present at the upward position B is established as a limit value. In this way, the outputs of detection signal stored corresponding to the respective positions may be handled as the positional data corresponding to the designated positions (designated range) of the wafer guide 31 in and above the cleaning bath 30. Alternatively, the above outputs may be handled as the rotational data corresponding to the rotating angles (i.e. rotational positions) of the rotating shaft 53 of the motor 49.

In the normal operation, for example, when falling the wafer guide 31 to the wafer guide 31 to the so-established cleaning position A, a command pulse is generated from the controller 63 to the driver 62 and then a drive current flows from the driver 62 to the motor 49. On the other hand, a detection signal about the rotating angle of the rotating shaft 53 of the motor 49 is transmitted from the absolute encoder 55 to the driver 62, as a signal data for the absolute value. The driver 62 obtains the positional information about the wafer guide 31 by the so-inputted detection signal and further outputs the positional information to the controller 63, in the form of an output of the position sensor. Then, with the so-inputted positional information, the controller 63 confirms whether the wafer guide 31 is positioned according to the command or not. Also, in case of elevating the wafer guide 31 to the upward position B, the similar actions are carried out. Note, even when the wafer guide 31 is moving up or down between the cleaning position A and the upward position B, an output of detection signal from the absolute encoder 55 allows the present position of the wafer guide 31 to be transmitted to the controller 63. In this way, since the output of the absolute encoder 55 substitutes for the position sensor, the controller 63 is capable of obtaining an output of the position sensor despite no position sensor on a returning way of the wafer guide 31.

As mentioned before, the absolute encoder 55 is capable of detecting the rotational position of the rotating shaft 53 of the motor 49 from the optional point of reference, namely, the rotating angle (absolute angle). Therefore, according to the servo-system of the embodiment, even if shutting off the power, there is no fear of missing the present position of the wafer guide 31, whereby the present position of the wafer guide 31 can be always provided clearly. To the contrary, if shutting off the power for an encoder employed in the conventional servo-system, there arises a possibility of missing the present position of the wafer guide 31. Further, it may be supposed to connect the absolute encoder 55 with a shaft of the conventional servo-motor (with an encoder) through a belt or the like. In such a case, however, there is some fear of a difference in rotation between the motor 49 and the absolute encoder 55 due to an expansion of the belt etc. Further, even if joining the servo-motor to the absolute encoder 55 coaxially without using a belt, such a connection would require a space for three mechanisms of the motor 49, the encoder and the absolute encoder 55, thereby causing an attachment space for the connection to be enlarged while requiring the driver 62 forming the servo-system and also a receiver to accept a signal from the absolute encoder 55. Thus, according to the invention, owing to the adoption of a servo-motor where the absolute encoder 55 is directly connected to the motor 49, it is possible to reduce the size of the attachment space and also possible to produce an effect to get rid of a difference in rotation between the motor 49 and the absolute encoder 55, and so on.

The controller 63 is constructed so as to have established values inputted from a main controller 65. Further, inputting the positional information of the wafer guide 31 and the same of the wafer chucks 20a, 20b, the controller 63 can recognize both of the position of the wafer guide 31 and the positions of the wafer chucks 20a, 20b.

In the control means 60, the operations of the transferring/driving means 21 and the motor 49 are controlled so that the wafer guide 31 does not collide with the wafer chucks 20a, 20b. For example, on confirmation that the wafer guide 41 is present at the above-mentioned cleaning position A or the upward position B, the controller 63 inputs a signal to drive the transferring/driving means 21 to the transfer driver 61. Consequently, only when the wafer guide 31 is positioned at the cleaning position A or the upward position B, it becomes possible to move the wafer chucks 20a, 20b above the cleaning bath 30 or possible to remove the wafer chucks 20a, 20b from the upside of the cleaning bath 30. Note, when the wafer guide 31 is moving up or down between the cleaning position A and the upward position B, the controller 63 inputs a signal to stop the drive of the transferring/driving means 21 to the transfer driver 61 in accordance with the interlock on the chucks. As a result, the wafer chucks 20a, 20b are brought into their immovable conditions.

Additionally, the controller 63 inputs a signal to drive the motor 49 to the driver 62, for example, on confirmation that the drive of the transferring/driving means 21 is stopped. Consequently, only when the wafer chucks 20a, 20b are at a standstill, the rotating shaft 53 of the motor 49 rotates thereby to allow the wafer guide 31 to be moved up and down. Note, when the wafer chucks 20a, 20b are moving up or down between the cleaning position A and the upward position B, the controller 63 inputs a signal to stop the drive of the motor 49 to the driver 62 in accordance with the interlock on the wafer guide. As a result, the wafer guide 31 is brought into its immovable condition.

Note, against the other cleaning apparatuses 12, 13 of the cleaning system 1, the control means 60 performs the similar control where the transferring/driving means 21 and the motor 49 are controlled so as not to cause the collision between the wafer guide 31 and the wafer chucks 20a, 20b.

Meanwhile, in the above-constructed cleaning system 1 in accordance with the embodiment of the present invention, it is first performed to mount the carriers C, each of which has e.g. twenty-five pieces of non-cleaned wafers W accommodated therein, on the carrier loading/unloading part 5 by a not-shown transfer robot. The carriers C loaded into the carrier loading/unloading part 5 are transferred to the loader/unloader part 6 by the transfer arm 8. Then, the wafers W taken out of the carrier C at the loader/unloader part 6 are grasped by the wafer chucks 20a, 20b of the transferring apparatus 15 collectively. Then, the wafers W are properly transported to the cleaning apparatuses 11 to 13 where contaminants adhering to the surfaces of the wafers W are removed in the cleaning process and finally, the wafers W are transported to the drying apparatus 10 to dry them. The wafers W on completion of the predetermined cleaning and drying operations in the above way are returned to the loader/unloader part 6 and accommodated into the carrier C again. Then, the carrier C accommodating the wafers W after cleaning and sequent drying is transferred from the loader/unloader part 6 to the carrier loading/unloading part 5 and subsequently, they are discharged by a not-shown transfer robot.

Hereat, referring to FIGS. 6 to 14, we now explain the operation and control when the transferring apparatus 15 loads or unloads the wafers W into or from the cleaning apparatuses 11 to 13, in detail. Note, the loading/unloading of the wafers W against the cleaning apparatus 11 will be described in detail, representatively.

First of all, when the controller 63 controls the operation of the transfer driver 61 so as to start the operation of the transferring/driving means 21, the wafer chucks 20a, 20b of the transferring apparatus 15 slide to the cleaning apparatus 11, as shown in FIG. 6. In this way, the wafers W held by the wafer chucks 20a, 20b are loaded into the cleaning apparatus 11. Besides, before loading the wafers W into the cleaning apparatus 11 in the above way, the wafer guide 31 is lowered in advance thereby to occupy the cleaning position A on the bottom in the cleaning bath 30.

In this case, the situation where the wafer guide 31 is taking the cleaning position A is detected on the ground of the detection signal of the rotating angle inputted from the absolute encoder 55, by the driver 62 and therefore recognized by the controller 63. If the wafer guide 31 does not take the cleaning position A, then the controller 63 carries out the interlocking operation upon recognition that the wafer guide 31 is not positioned at the cleaning position A. That is, the controller 63 outputs a command of stopping the operation of the transferring/driving means 21 to the transfer driver 61. Consequently, the slide movement of the wafer chucks 20a, 20b is suspended thereby to prevent an occurrence of collision between the wafer guide 31 and the wafer chucks 20a, 20b in loading the wafers W into the cleaning apparatus 11.

The detection signal inputted into the driver 62 is compared with data previously memorized in the driver 62 in correspondence to the cleaning position A, except that the signal is used as a signal to feed the position of the wafer guide 31 back to the driver 62. If an output value of the detection signal inputted from the absolute encoder 55 is included in a predetermined range prescribing the cleaning position A, the driver 62 outputs e.g. ON (or OFF) signal to the controller 63, as the positional information of the wafer guide, namely, an output of the position sensor. Consequently, it is possible to detect the position of a moving body, such as the wafer guide 31, without arranging an optical position sensor etc. for detecting the position of the wafer guide 31 in e.g. the cleaning bath 30.

As shown in FIG. 7, when the wafer W are transferred above the cleaning bath 30 as a result of loading the wafers W held by the wafer chucks 20a, 20b into the cleaning apparatus 11, the operation of the transferring/driving means 21 is once suspended in the transferring apparatus 15. In this case, the positional information about the wafer chucks 20a, 20b is transmitted to the controller 63 through the position sensors 64 corresponding to the cleaning apparatus 11, while the controller 63 recognizes that the wafers W have been transferred above the cleaning bath 30 by the wafer chucks 20a, 20b and further controls the operation of the transfer driver 61 so as to stop the operation of the transferring/driving means 21. In this way, there is established a condition where the wafers W are loaded and positioned above the cleaning bath 30 of the cleaning apparatus 11.

Figure 8:
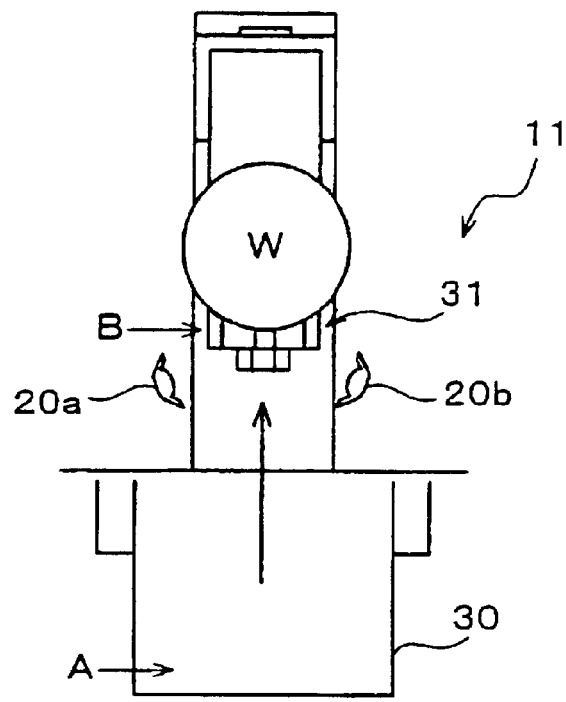
FIG. 8 is an explanatory view of a process showing a condition that the wafers have been received by a wafer guide.

When the wafers W are loaded above the cleaning bath 30 in the above way, the controller 63 controls the driver 62 so as to drive the motor 49. As a result, the wafer guide 31 rises along the guide-Z shaft 54. When passing (rising) through a clearance between the wafer chucks 20a, 20b on the wafer guide's upward way from the cleaning position A to the upward position B, the wafer guide 31 receives the wafers W from the wafer chucks 20a, 20b and subsequently rises up to the upward position B, as shown in FIG. 8. The fact of the wafer guide 31 being elevated up to the upward position B is detected by the driver 62 on the ground of the detection signal of the rotating angle inputted from the absolute encoder 55 and therefore recognized by the controller 63. Upon recognition of the wafer guide 31 being elevated up to the upward position B, the controller 63 stops the drive of the motor 49 through the driver 62.

Also in this case, the detection signal inputted from the driver 62 is compared with data previously memorized in the driver 62 in correspondence to the upward position B. If an output value of the detection signal inputted from the absolute encoder 55 is included in a predetermined range prescribing the upward position B, the driver 62 outputs e.g. ON (or OFF) signal to the controller 63, as the positional information of the wafer guide, namely, an output of the position sensor. Accordingly, there is no need to arrange an optical position sensor etc. above the cleaning bath 30.

Further, it is possible to not only generate the standstill position of the rotating shaft of the motor 49 (standstill position of the wafer guide 31) in the form of a sensor output but also generate the rotating position of the rotating shaft of the motor 49 in the form of another sensor output. For example, with the establishment at the teaching work, by making the driver 62 previously store the data of output values of the detection signals from the absolute encoder 55 when e.g. the wafer guide 31 moves from the cleaning position A to the upward position B, it is possible to transmit the positional information that which of areas the wafer guide 31 in the normal operation is traveling (which of positions the rotating shaft 53 of the motor 49 is rotating, i.e. the rotating angle) to the controller 63, in the form of outputs of area sensors. There is no need to establish a single area between the cleaning position A and the upward position B. When the area between the cleaning position A and the upward position B is classified into some areas, for example, the first area close to the cleaning position A, the second area in the middle between the cleaning position A and the upward position B and the third area close to the upward position B, it is possible to output the present position of the wafer guide 31 more precisely. That is, the operative position of the wafer guide 31 can be detected without providing any position sensor or area sensor on a return way of the wafer guide 31.

Even if the normal operation of the wafer guide 31 is recovered after the power supply has been shut off (after OFF-state in the power supply) during an ascent (descent) of the wafer guide 31, then this absolute encoder 55 does not require initializing to search the point of reference, but the same encoder can maintain the rotating angle, i.e., rotational position of the rotating shaft 53 of the motor 49 before shutting off the power (before OFF-state in the power supply). Accordingly, once the power supply is recovered (power: ON), the wafer guide 31 can perform its next action from the present position quickly.

Figure 9:
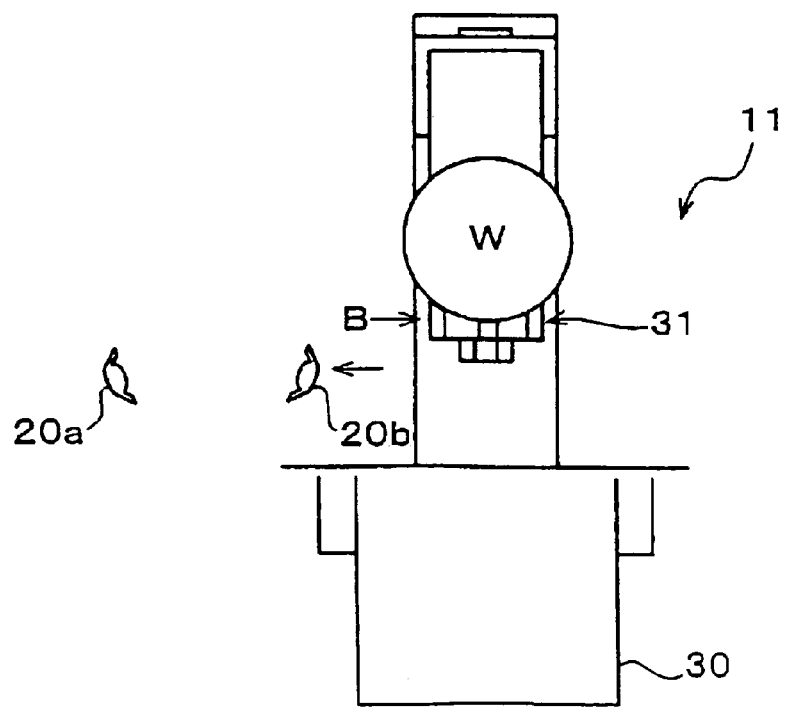
FIG. 9 is an explanatory view of a process showing a condition that wafer chucks have been withdrawn from the cleaning apparatus.

Next, the controller 63 controls the transfer driver 61 so as to start the operation of the transferring/driving means 21. Consequently, as shown in FIG. 9, the wafer chucks 20a, 20b are slid to withdraw from the cleaning apparatus 11. The fact of the wafer chucks 20a, 20b being withdrawn from the cleaning apparatus 11 is inputted into the controller 63 through the transfer driver 61 and successively, the controller 63 controls the transfer driver 61 so as to stop the operation of the transferring/driving means 21 on recognition of the withdrawal of the wafer chucks 20a, 20b from the cleaning apparatus 11.

The controller 63 that has recognized the wafer chucks 20a, 20b being withdrawn from the cleaning apparatus 11 controls the driver 62 so as to drive the motor 49 again thereby to lower the wafer guide 31 along the guide-Z shaft 54. In this way, as shown in FIG. 10, the wafer guide 31 is lowered to the cleaning position A. The fact of the wafer guide 31 being lowered to the cleaning position A is detected by the driver 62 on the ground of the detection signal of the rotating angle inputted from the absolute encoder 55 and therefore recognized by the controller 63. Upon recognition of the wafer guide 31 being lowered to the cleaning position A, the controller 63 stops the drive of the motor 49 through the driver 62. As a result of lowering the wafer guide 31 to the cleaning position A, the wafers W are accommodated in the cleaning bath 30, so that the wafers W are dipped into the cleaning liquid filled in the cleaning bath 30, accomplishing the cleaning operation against the wafers W.

After completing the designated cleaning in the cleaning apparatus 11, the controller 63 controls the driver 62 so as to drive the motor 49 again thereby to elevate the wafer guide 31 along the guide-Z shaft 54. Thus, as shown in FIG. 11, the wafer guide 31 is raised up to the upward position B to lift the wafers W on completion of cleaning by the cleaning apparatus 11, upside of the cleaning bath 30. The fact of the wafer guide 31 being elevated to the upward position B is detected by the driver 62 on the ground of the detection signal of the rotating angle inputted from the absolute encoder 55 and therefore recognized by the controller 63. Upon recognition of the wafer guide 31 being raised up to the upward position B, the controller 63 controls the driver 62 so as to stop the drive of the motor 49.

Figure 12:
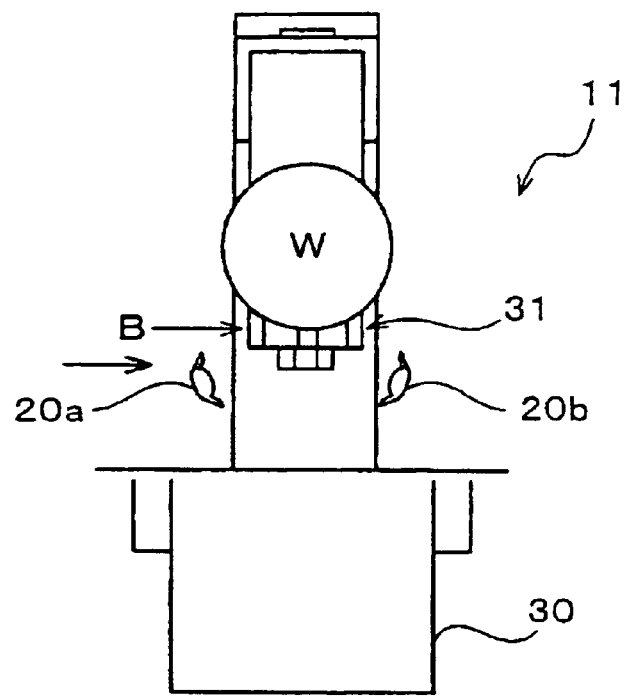
FIG. 12 is an explanatory view of a process showing a condition that the wafer chucks have been brought above the cleaning bath again.

Next, the controller 63 controls the transfer driver 61 so as to start the operation of the transferring/driving means 21 again. Consequently, as shown in FIG. 12, the wafer chucks 20a, 20b are slid to position above the cleaning bath 30. Then, upon recognition of the wafer chucks 20a, 20b being moved to the upside of the cleaning bath 30, the controller 63 controls the transfer driver 61 so as to stop the drive of the transferring/driving means 21.

Note, when moving the wafer chucks 20a, 20b to the upside of the cleaning bath 30, the situation where the wafer guide 31 has been elevated to the upward position B is detected by the driver 62 on the ground of the detection signal of the rotating angle inputted from the absolute encoder 55 and therefore recognized by the controller 63. If the wafer guide 31 does not take the upward position B, then the controller 63 carries out the interlocking operation upon recognition that the wafer guide 31 is not positioned at the upward position B. That is, the controller 63 outputs a command of stopping the operation of the transferring/driving means 21 to the transfer driver 61. Consequently, the slide movement of the wafer chucks 20a, 20b is suspended thereby to prevent an occurrence of collision between the wafer guide 31 and the wafer chucks 20a, 20b.

Figure 13:
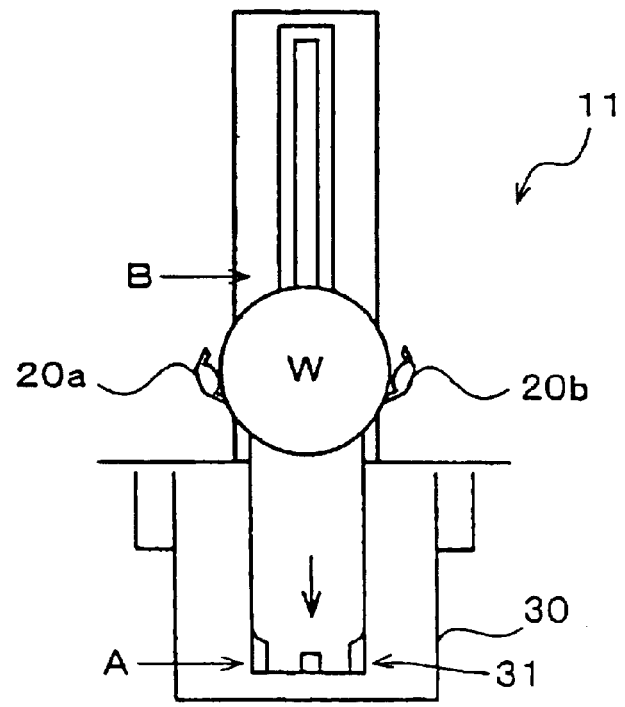
FIG. 13 is an explanatory view of a process showing a condition that the wafers have been delivered to the wafer chucks.

After moving the wafer chucks 20a, 20b to the upside of the cleaning bath, the controller 63 controls the driver 62 so as to drive the motor 49 thereby to lower the wafer guide 31 along the guide-Z shaft 54. In this way, as shown in FIG. 13, when passing (falling) through the clearance between the wafer chucks 20a, 20b on the wafer guide's downward way from the upward position B to the cleaning position A, the wafers W are delivered from the wafer guide 31 to the wafer chucks 20a, 20b. Consequently, the wafer guide 31 is lowered to the cleaning position A without holding the wafers W. The fact of the wafer guide 31 being lowered to the cleaning position A is detected by the driver 62 on the ground of the detection signal of the rotating angle inputted from the absolute encoder 55 and therefore recognized by the controller 63. Upon recognition of the wafer guide 31 being lowered to the cleaning position A, the controller 63 controls the driver 62 so as to stops the drive of the motor 49.

Figure 14:
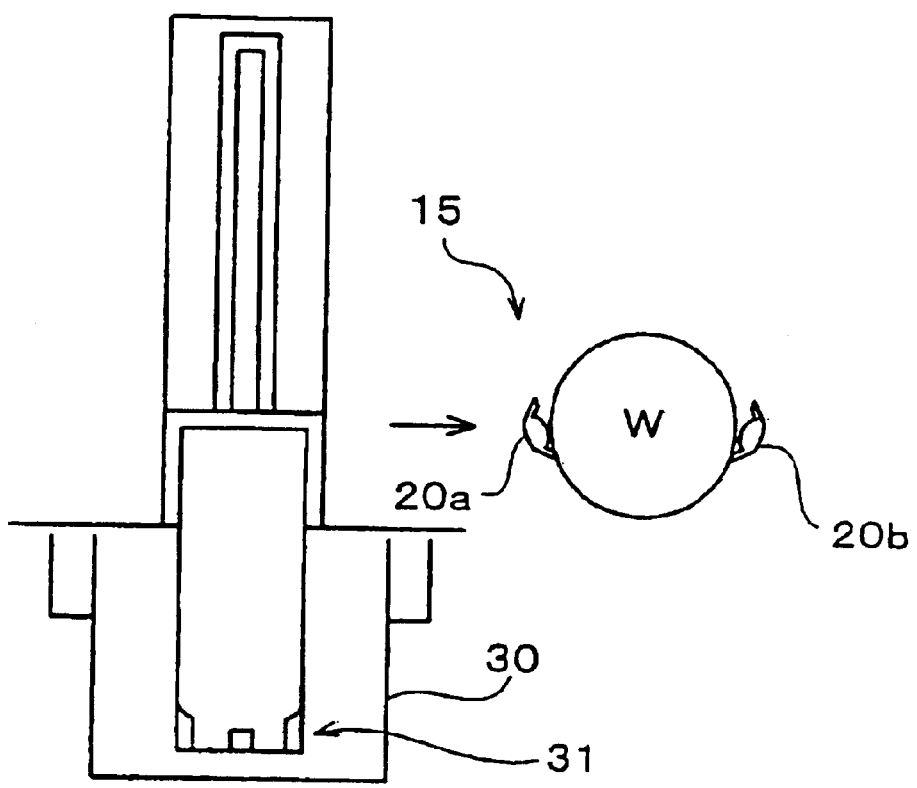
FIG. 14 is an explanatory view of a process showing a condition that the wafers completing the cleaning operation in the cleaning apparatus have been unloaded from the cleaning apparatus.

Next, when the controller 63 recognizes that the wafer guide 31 has been lowered to the cleaning position A, the controller 63 controls the transfer driver 61 so as to start the drive of the transferring/driving means 21. Then, as shown in FIG. 14, the wafer chucks 20a, 20b are slide along the rail 22 to discharge the wafers W completing the cleaning operation in the cleaning apparatus 11, therefrom. Thus, the wafers W unloaded from the cleaning apparatus 11 are successively loaded into the cleaning apparatus 12 and the cleaning apparatus 13 in accordance with the similar process, thereby effecting the cleaning operations in the cleaning apparatuses 12, 13. Then, on completion of cleaning in the cleaning apparatuses 11 to 13, the wafers W are dried in the drying apparatus 10, as mentioned before. Thereafter, the wafers W are accommodated in the carrier C at the loader/unloader part 6 and unloaded at the loading/unloading part 5 by the not-shown transfer robot.

According to the cleaning system 1 of this embodiment, since the position of the wafer guide 31 is detected by the absolute encoder 55, there is no need to provide a number of optical sensors for detecting the position of the wafer guide 31 as in the past, thereby simplifying the structure of the apparatus remarkably and also facilitating its maintenance. Especially, even if a power cut is caused suddenly, the absolute encoder 55 stores the position of the wafer guide 31 by the absolute angle of the rotating shaft 53. Thereafter, when the operation of the apparatus is recovered, the position of the wafer guide 31 can be immediately detected by the driver 62 and therefore, there is no need to redo the initializing work for apparatus, etc. Additionally, it is possible to ensure the safety of the apparatus itself because the controller 60 carries out the "interlock" control on both the transferring/driving means 21 and the motor 41 so that the wafer guide 21 does not interfere with the wafer chucks 20a, 20b.

Although one example of the preferred embodiments of the present invention has been illustrated hereinabove, the present invention is not limited to the above-mentioned embodiment only. For example, in order to avoid the collision between the transfer arm 8 for transferring the carrier C accommodating the substrates and the wafer chucks 20a, 20b of the transferring apparatus 15, it is preferable, in a transfer-driving mechanism (not shown) and a transfer driver (not shown) both forming a servo-system of the transfer arm 8, that the controller 63 inputs an establishment for sequential control program etc. into the transfer driver thereby to apply the "interlock" control on the transfer-driving mechanism and the motor 49. Additionally, for example, the processing bath is not limited to only the cleaning bath filled up with a cleaning liquid, but the cleaning bath may be replaced by another bath filled up with one of other various processing liquids thereby to apply the other processing besides cleaning on the substrates. Without being limited to the semiconductor wafer, the other substrates, for example, LCD substrate glass, CD substrate, print baseplate, ceramic substrate, etc. may constitute the substrate of the invention.

According to the present invention, it is possible to provide a transferring apparatus, a substrate processing apparatus and a substrate processing system with respective simplified structures that do not require a number of conventional optical sensors. Especially, owing to the adoption of the absolute encoder, even if an accident, such as power cut, is caused suddenly, the position of the substrate holding means could be detected as soon as the apparatus is operatively recovered from the power cut since the position of the holding means is detected by the absolute angle of the rotating shaft and therefore, there is no need to redo the initializing of the apparatus. Additionally, it is possible to ensure the safety of the apparatus itself since the collision between the substrate holding means and the transfer holding means is avoided.

What is claimed is:

1. A transferring apparatus comprising:
   at least two moving bodies with mutual interference potential, at least one moving body being driven by a motor; and
   a detection unit for detecting a position of the at least one moving body, the detection unit includes:
      an absolute encoder directly connected to the motor thereby to detect a revolution amount of a rotating shaft of the motor and further output a detection signal,
      a driver for receiving the detection signal outputted from the absolute encoder thereby to output a positional information of the at least one moving body, said positional information determined by using an established proportional relationship between a rotational angle of the rotating shaft of the motor and the position of the at least one moving body, and a controller for inputting a sequence control program to the driver and receiving the positional information outputted from the driver thereby to judge the position of the at least one moving body; and wherein the driver controls the motor according to the inputted sequence control program, the controller controlling movements of the at least two moving bodies in a manner that the at least one moving body does not interfere with any other moving body.

2. A transferring apparatus as claimed in claim 1, wherein the positional information outputted from the driver to the controller is identical to a sensor output which is generated by detecting whether the moving body is positioned in a predetermined area when the rotating shaft is rotating and/or stops rotating.

3. A transferring apparatus as claimed in claim 1, wherein the moving body is a substrate holder that moves while holding a substrate.

4. A substrate processing apparatus comprising:

a transferring apparatus including:

at least two substrate holders with mutual interference potential, at least one substrate holder being driven by a motor; and a detection unit for detecting a position of the at least one substrate holder, the detection unit includes:

an absolute encoder directly connected to the motor thereby to detect a revolution amount of a rotating shaft of the motor and further output a detection signal;

a driver for receiving the detection signal outputted from the absolute encoder thereby to output a positional information of the at least one substrate holder, said positional information determined by using an established proportional relationship between a rotational angle of the rotating shaft of the motor and the position of the at least one substrate holder; and a controller for inputting a sequence control program to the driver and receiving the positional information outputted from the driver thereby to judge the position of the at least one substrate holder;

wherein the driver controls the motor according to the inputted sequence control program, the controller controlling movements of the at least two substrate holders in a manner that the at least one substrate holder does not interfere with any other substrate holder; and a processing bath for processing a substrate;

wherein the substrate holder is movable to accommodate the substrate in the processing bath.

5. A substrate processing apparatus comprising:

a transferring apparatus including:

at least one first substrate holder and at least one second substrate holder with mutual interference potential, the at least one first substrate holder being driven by a motor; and a detection unit for detecting a position of the at least one first substrate holder, the detection unit includes:

an absolute encoder directly connected to the motor thereby to detect a revolution amount of a rotating shaft of the motor and further output a detection signal;

a driver for receiving the detection signal outputted from the absolute encoder thereby to output a positional information of the at least one first substrate holder, said positional information determined by using an established proportional relationship between a rotational angle of the rotating shaft of the motor and the position of the at least first one substrate holder; and a controller for inputting a sequence control program to the driver and receiving the positional information outputted from the driver thereby to judge the position of the first substrate holder;

wherein the driver controls the motor according to the inputted sequence control program, the controller controlling movements of the at least two substrate holders in a manner that the at least one substrate holder does not interfere with any other substrate holder; and a processing bath for processing a substrate;

wherein the first substrate holder is movable to accommodate the substrate in the processing bath, while the second substrate holder transfers the substrate thereby to give and receive the substrate to and from the first substrate holder, the second substrate holder being provided with drive means for moving the second substrate holder and the controller controls the drive means and the motor.

6. A substrate processing apparatus as claimed in claim 5, wherein the controller controls the drive means and the motor so that the first substrate holder does not collide with the second substrate holder.

7. A substrate processing apparatus comprising:

a plurality of processing baths arranged in a horizontal direction to process a substrate therein;

a plurality of first substrate holders provided for the plurality of processing baths respectively, the first substrate holders each moving between a position inside the corresponding processing bath and another position above the corresponding processing bath, in a vertical direction;

a plurality of vertical movement units for moving the plurality of first substrate holders in the vertical direction;

a second substrate holder which holds the substrate and moves to the horizontal direction above the plurality of processing baths;

a horizontal movement unit for moving the second substrate holder in the horizontal direction; and a control unit which drives the vertical movement units and the horizontal movement unit so that the first substrate holders and the second substrate holder do not interfere with each other, thereby to move the first substrate holders and the second substrate holder.

8. A substrate processing apparatus as claimed in claim 7, further comprising a plurality of position sensors which are arranged in respective positions along a horizontal movement of the second substrate holder thereby to detect various horizontal positions of the second substrate holder.

* * * * *